(12) United States Patent
Tamura et al.

(10) Patent No.: US 7,304,556 B2
(45) Date of Patent: Dec. 4, 2007

(54) BUCKLING ACTUATOR

(75) Inventors: Masaya Tamura, Sagamihara (JP); Shinji Kobayashi, Sagamihara (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 325 days.

(21) Appl. No.: 10/527,731

(22) PCT Filed: Jun. 25, 2004

(86) PCT No.: PCT/JP2004/008976

§ 371 (c)(1),
(2), (4) Date: Mar. 14, 2005

(87) PCT Pub. No.: WO2005/015287

PCT Pub. Date: Feb. 17, 2005

(65) Prior Publication Data

US 2006/0072180 A1 Apr. 6, 2006

(30) Foreign Application Priority Data

Aug. 11, 2003 (JP) ............................. 2003-291665

(51) Int. Cl.
*H01H 51/22* (2006.01)
(52) U.S. Cl. ......................................... 335/78; 200/181
(58) Field of Classification Search .................. 335/78; 200/181
See application file for complete search history.

(56) References Cited

U.S. PATENT DOCUMENTS 6,144,545 A * 11/2000 Lee et al. .................... 361/233
6,303,885 B1 10/2001 Hichwa et al.
6,360,033 B1 3/2002 Lee et al.
6,771,001 B2 * 8/2004 Mao et al. ................... 200/181
6,828,887 B2 12/2004 Kubby et al.
2006/0215348 A1 * 9/2006 Won et al. ................... 361/277

FOREIGN PATENT DOCUMENTS

JP 2004-025437 1/2004

* cited by examiner

*Primary Examiner*—Elvin Enad
*Assistant Examiner*—Bernard Rojas
(74) *Attorney, Agent, or Firm*—Keating & Bennett, LLP

(57) ABSTRACT

A buckling actuator has a connecting section of a supporting beam that is provided with a rotatable supporter for allowing a movable member to be stably maintained at one of two switch positions. A substrate, stationary members, rotatable supporters, and supporting beams support a movable member in a shiftable manner in a y-axis direction, such that the movable member can be shifted between first and second switch positions. Moreover, the rotatable supporters are each provided with arm portions which extend in a radial fashion and support the corresponding supporting beam in a rotatable manner. When the movable member is being shifted, each supporting beam can be rotated without having to bend a corresponding end by a significant amount. Thus, a large barrier ΔE of potential energy of the movable member is set between the first and second switch positions. The movable member can therefore be stably maintained at each of the switch positions even when electric power is not supplied to electrodes. Furthermore, each arm portion prevents the movable member from being displaced in an x-axis direction.

19 Claims, 14 Drawing Sheets

BUCKLING ACTUATOR

BACKGROUND OF THE INVENTION

1. Field of the Invention

The present invention relates to buckling actuators used as, for example, optical switch devices and optical shutters, in which supporting beams can be buckled in order to shift a movable member between two alternative positions.

2. Description of the Related Art

Generally, buckling actuators are used as optical switch devices which perform switching of an optical path by shifting a movable member (for example, see U.S. Pat. No. 6,360,033 which is hereinafter referred to as Patent Document 1; and U.S. Pat. No. 6,303,885 which is hereinafter referred to as Patent Document 2).

Conventional optical switch devices generally include a substrate, a movable member disposed above the substrate and being shiftable in a predetermined shifting direction, a stationary member which is disposed on the substrate and supports the movable member, a plurality of supporting beams each of which is connected between the stationary member and the movable member and can be buckled (is bendable) in the shifting direction of the movable member, and a switching mechanism for switching the position of the movable member with an electrostatic force.

The movable member has a thin rod-like body extending in the shifting direction and is supported by the supporting beams disposed on both sides of the movable member in the width direction. Moreover, one end of the movable member is provided with a mirror for reflecting light. The movable member is capable of being shifted between a first switch position in which the mirror enters an optical path and a second switch position in which the mirror moves away from the optical path. Furthermore, the switching mechanism includes electrodes having a comb-like structure, which are respectively provided on the substrate and the movable member. When an electrostatic force is generated between these electrodes, the movable member is shifted to one of the switch positions so as to switch the optical path.

According to a conventional buckling actuator disclosed in Patent Document 1, when the movable member is positioned at, for example, the first switch position, the supporting beams are maintained in an initial state where the supporting beams form a substantially S-shape. When the movable member is shifted to the second switch position, the supporting beams become buckled so as to form a substantially reverse S-shape with respect to the initial state. Thus, the resilient force (spring force) of the supporting beams allows the movable member to be maintained at the corresponding switch position.

The potential energy of the movable member, which is dependent upon, for example, the spring force of the supporting beams, is zero when the supporting beams are in the initial state, i.e. the first switch position, but reaches a maximum value as the supporting beams are bent in the process of the shifting of the movable member. When the supporting beams become substantially reverse-S-shaped in the second switch position, the spring force is directed in the opposite direction. For this reason, the potential energy of the movable member decreases from the maximum value. Accordingly, the maximum value defines a barrier of potential energy between the first and second switch positions, such that the movable member can be maintained at the corresponding switch position.

On the other hand, according to a conventional buckling actuator disclosed in Patent Document 2, each of the supporting beams is shiftable along a longitudinal direction thereof in view of the fact that the distance between the opposite ends of the supporting beam becomes smaller as the movable member is shifted. In such a case, the supporting beams are connected with, for example, narrow sections of the movable member, which are bendable in the width direction of the movable member. This allows the supporting beams to move in the longitudinal direction of the supporting beams by a required amount.

In the conventional art according to Patent Document 1 and Patent Document 2, it is important that the movable member can be stably shifted between the two switch positions, and can be stably maintained at the corresponding switch position. In order to achieve these results, the difference in potential energy (i.e. a barrier $\Delta E'$ (delta E') of potential energy illustrated in FIG. 8 as conventional art, which will be described later with respect to preferred embodiments of the present invention) must be large.

However, according to the conventional art, it is difficult to provide a design that allows the barrier $\Delta E'$ of potential energy to be large since the supporting beams are in a completely restrained state. If the barrier $\Delta E'$ is small, the movable member may undesirably be shifted back to its initial position due to counter-reaction, or may be shifted to its initial position due to an external force.

In order to increase the barrier $\Delta E'$ of potential energy to stably drive or maintain the movable member, an angle of each supporting beam must be set to be more obtuse with respect to the perpendicular direction of the movable member in order to provide larger positive and negative regions of the spring force of the supporting beams.

For this reason, the conventional art is problematic in view of the fact that the voltage applied to the comb-like electrodes must be large. Although the electrostatic force is originally applied to the comb-like electrodes only in the longitudinal direction, if the voltage applied is large, the force components of the electrostatic force in a direction perpendicular to the longitudinal direction may undesirably be applied to the movable member due to an imbalanced electrostatic force caused by, for example, inconsistent processing. This may cause the comb-like electrode of the movable member to come into contact with the comb-like electrode of the substrate, and may thus lead to a short circuit between the electrodes. Accordingly, this may result in a malfunction of the actuator.

Furthermore, according to the first embodiment of Patent Document 1 and the conventional art of Patent Document 2, the supporting beams are shiftable in the longitudinal direction thereof, i.e. the width direction of the movable member. This moderates a buckling load applied to each supporting beam in its longitudinal direction, and is thus advantageous in that a force required to shift the movable member to the buckling position of the supporting beams can be reduced. However, since the supporting beams can be moved easily in the width direction of the movable member, this structure may be problematic in that the supporting beams may cause the comb-like electrodes to come into contact with each other, thereby causing a short and malfunction of the device as described above.

Furthermore, according to the conventional art, when the supporting beams are buckled in the process of the shifting of the movable member, the narrow sections of the movable member are bent in the width direction of the movable member so as to relieve the spring force generated by the buckled supporting beams. As a result, when the spring force applied to the movable member weakens in the process of the shifting of the movable member, the maximum value of the potential energy (i.e. the barrier of potential energy) that is dependent upon, for example, the spring force, becomes lower.

For this reason, according to the conventional art of Patent Document 1 and Patent Document 2, the movable member can easily overcome the barrier of potential energy, meaning that the movable member can be easily switched back and forth between the first and second switch positions. This is problematic in that the movable member may automatically be shifted even with, for example, a small external impact, thus leading to improper operation and low reliability of the optical switch device.

SUMMARY OF THE INVENTION

In order to overcome the problems described above, preferred embodiments of the present invention provide a highly-reliable buckling actuator in which a movable member can be stably shifted in a predetermined direction and a high energy barrier is set between switch positions so as to prevent, for example, short circuits and improper operations.

In order to achieve the above-mentioned advantages, the preset invention provides a buckling actuator including a substrate, a movable member disposed above the substrate and shiftable in a predetermined shifting direction, a stationary member which is disposed on the substrate and supports the movable member, a supporting beam which is connected between the stationary member and the movable member in a buckling manner and supports the movable member at one of two switch positions, the two switch positions being distant from each other in the shifting direction of the movable member, and switching device for switching the position of the movable member between the two switch positions.

The buckling actuator according to a preferred embodiment of the present invention is distinctive in that one of a connecting section between the stationary member and the supporting beam and a connecting section between the movable member and the supporting beam is provided with a rotatable supporter including at least three arm portions extending in directions different from one another, the rotatable supporter supporting the supporting beam in a rotatable manner about an axis line extending substantially perpendicular to the substrate.

According to a preferred embodiment of the present invention, since one of the connecting section between the stationary member and the supporting beam and the connecting section between the movable member and the supporting beam is provided with the rotatable supporter including at least three arm portions for supporting the supporting beam in a rotatable manner, the arm portions of the rotatable supporter can be bent with respect to an end of the supporting beam when the movable member is being shifted. Thus, the supporting beam can be smoothly rotated by the rotatable supporter without having to bend the supporting beam by a significant amount.

Consequently, since the end of the supporting beam does not need to be bent by a significant amount, the reaction force applied to the supporting beam during the bending process is reduced due to the rotatable supporter. This provides a sufficiently large barrier of potential energy between the switch positions. Accordingly, this prevents the movable member from being undesirably switched between the switch positions due to an external force, such as an impact and vibration, and moreover, prevents, for example, improper operation of the actuator so as to improve the reliability of the actuator.

Moreover, at least one of the arm portions, for example, may extend in a direction that is substantially perpendicular to the shifting direction of the movable member. Specifically, at least one arm portion restricts the movement of the movable member via the supporting beam so that the movable member can move only in a predetermined direction. Thus, the movable member is prevented from being displaced sideways with respect to the predetermined shifting direction so as to achieve a stable shifting of the actuator.

Furthermore, according to a preferred embodiment of the present invention, at least three arm portions of the rotatable supporter are preferably three arm portions extending away from an end of the supporting beam to form a substantially T-shape.

In this case, according to a preferred embodiment of the present invention, since the three arm portions of the rotatable supporter form a substantially T-shape, the arm portions can support the supporting beam in a rotatable manner, and moreover, the arm portion in the middle can extend, for example, in a direction that is substantially perpendicular to the shifting direction of the movable member. According to such a simple structure, the supporting beam can be smoothly rotated and the movable member is prevented from being dislocated. This achieves a simplified supporting structure for the movable member.

Furthermore, according to a preferred embodiment of the present invention, at least three arm portions of the rotatable supporter preferably extend away from an end of the supporting beam in a radial fashion.

According to a preferred embodiment of the present invention, since the arm portions of the rotatable supporter may extend away from the end of the supporting beam in a radial fashion, the arm portions can support the supporting beam in a rotatable manner, and moreover, one of the arm portions can extend, for example, in a direction that is substantially perpendicular to the shifting direction of the movable member. Thus, a required number of arm portions may be arranged in a radial manner so as to provide sufficient strength for the rotatable supporter. The arm portions can therefore stably support the supporting beam and allow the supporting beam to rotate smoothly.

Furthermore, according to a preferred embodiment of the present invention, each of the connecting section between the stationary member and the supporting beam and the connecting section between the movable member and the supporting beam may be provided with the rotatable supporter, such that each end of the supporting beam is rotatably supported by the corresponding rotatable supporter.

According to such a preferred embodiment of the present invention, since each of the connecting section between the stationary member and the supporting beam and the connecting section between the movable member and the supporting beam may be provided with the rotatable supporter, both ends of the supporting beam can be rotatably supported by the corresponding rotatable supporters. The movable member can thus be shifted without having to bend the supporting beam by a significant amount in these connecting sections with respect to the stationary member and the movable member. Accordingly, the reaction force applied to the movable member from the supporting beam during the bending process can be reduced due to the two rotatable supporters when the movable member is being shifted. This provides a larger barrier of potential energy between the switch positions of the movable member, and allows a stable switching operation for the actuator.

Furthermore, according to a preferred embodiment of the present invention, a midsection of the supporting beam in the longitudinal direction of the supporting beam may be provided with a reinforcing portion having higher rigidity than sections of the supporting beam adjacent to the ends of the supporting beam.

According to a preferred embodiment of the present invention, since the midsection of the supporting beam in the longitudinal direction of the supporting beam may be provided with the reinforcing portion, the movable member can further be maintained stably at the corresponding switch position. In this case, since the midsection of the supporting beam can be made less bendable with the reinforcing portion, the supporting beam can move smoothly when the movable member is being shifted. Moreover, the less-bendable supporting beam allows the barrier of potential energy between the switch positions of the movable member to be greater so as to provide a stable switching operation for the actuator.

In this case, according to a preferred embodiment of the present invention, a cross-section of the reinforcing portion is preferably at least twice as rigid as a cross-section of each end of the supporting beam.

According to a preferred embodiment of the present invention, since the cross-section of the reinforcing portion may be at least twice as rigid as the cross-section of each end of the supporting beam, the barrier (energy difference) of potential energy between the switch positions of the movable member can be set, for example, about 1.3 times greater in comparison with a case where no reinforcing portions are provided.

Furthermore, according to a preferred embodiment of the present invention, the switching device may shift the movable member by using an electrostatic force.

In one preferred embodiment of the present invention, since the switching device may shift the movable member by using an electrostatic force, the position of the movable member can be switched based on a simple structure in which an electrostatic force is generated between, for example, a stationary electrode and a movable electrode.

On the other hand, according to another preferred embodiment of the present invention, the switching device may shift the movable member by using a magnetic force.

In this preferred embodiment of the present invention, since the switching device may shift the movable member by using a magnetic force, the movable member may be composed of, for example, a magnetic material such that the movable member is shifted in a direction based on a magnetic field generated by, for example, an electromagnet. Thus, the movable member does not require power-supply elements, such as electrodes such that the structure of the actuator can be simplified.

Furthermore, according to another preferred embodiment of the present invention, the movable member, the stationary member, the supporting beam, the rotatable supporter, and the switching device are preferably formed of a single-crystal silicon material.

In such a preferred embodiment of the present invention, since the movable member, the stationary member, the supporting beam, the rotatable supporter, and the switching device may be formed of a single-crystal silicon material, the fine structures of, for example, the movable member, the stationary member, and the supporting beam can be efficiently fabricated in the same process by, for example, etching, so as to improve the degree of precision.

Furthermore, according to another preferred embodiment of the present invention, the movable member preferably moves toward and away from an optical path provided above the substrate based on the switch positions such that the movable member defines an optical switching unit for switching the optical path, the movable member being maintained at a corresponding one of the switch positions with a resilient force of the supporting beam.

In such a preferred embodiment of the present invention, since the movable member defines an optical switching unit and the resilient force of the supporting beam allows the movable member to be maintained at the corresponding one of the switch positions, the optical switching unit is capable of switching the optical path by shifting the movable member between the two switch positions. Moreover, since a sufficiently large barrier of potential energy is set between the switch positions due to the supporting beam, the resilience force of the supporting beam can allow the movable member to be maintained at the desired switch position even when the switching device is in an off state. Accordingly, the optical switching unit is prevented from being undesirably switched in an automatic manner due to, for example, an external force so as to achieve an improved reliability.

Other features, elements, steps, characteristics and advantages of the present invention will become more apparent from the following detailed description of preferred embodiments with reference to the attached drawings.

DETAILED DESCRIPTION OF PREFERRED EMBODIMENTS

Figure 1:
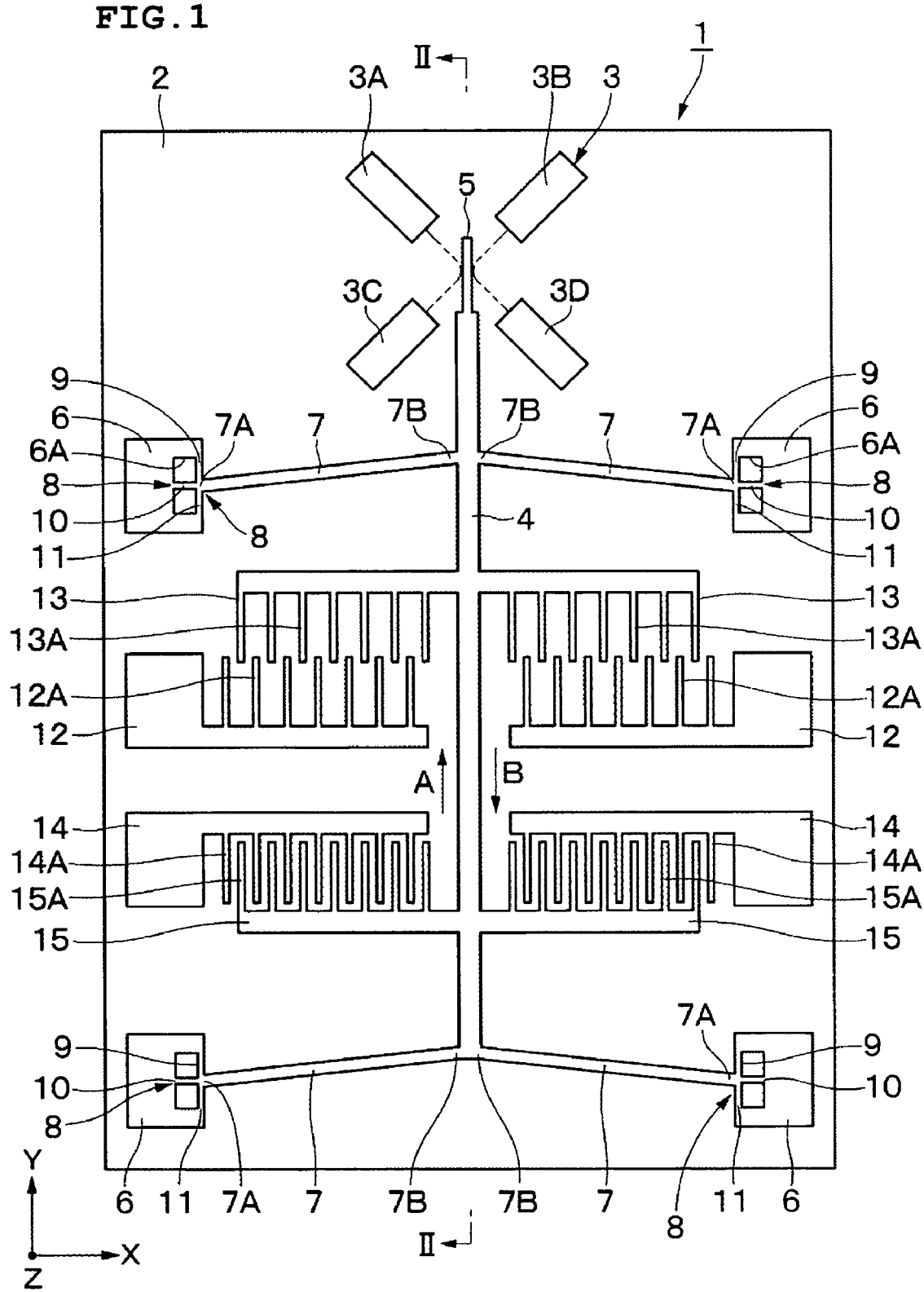
FIG. 1 is a front view of an optical switch device according to a first preferred embodiment of the present invention.

Preferred embodiments of a buckling actuator according to the present invention will now be described with reference to the drawings.

FIGS. 1 to 8 illustrate a first preferred embodiment in which a buckling actuator is preferably used, for example, as an optical switch device.

In the drawings, reference numeral 1 indicates an optical switch device, and reference numeral 2 indicates a substrate which functions as a base for the optical switch device 1. The substrate 2 is preferably formed of, for example, a substantially rectangular glass plate which is several millimeters in size. The substrate 2 has an x-axis, a y-axis, and a z-axis which are substantially perpendicular to one another. The substrate 2, for example, extends horizontally along the x-axis and the y-axis.

Furthermore, the front surface of the substrate 2 is preferably provided with, for example, a low-resistance single-crystal silicon material, which is etched to form a movable member 4; a mirror 5; stationary members 6; supporting beams 7; rotatable supporters 8; and electrodes 12, 13, 14, and 15 defining switching device for the optical switch device 1, which will be described later.

Reference numeral 3 indicates an optical unit which is disposed above the substrate 2 together with, for example, the movable member 4. The optical unit 3 includes emitters 3A and 3B for emitting light beams, and receptors 3C and 3D for receiving the light beams. The emitters 3A and 3B and the receptors 3C and 3D are each connected with, for example, fiber optics (not shown in the drawings). In the optical switch device 1, the position of the movable member 4 is shiftable such that optical paths for allowing input and output of light beams among the emitters 3A and 3B and the receptors 3C and 3D can be changed.

Figure 2:
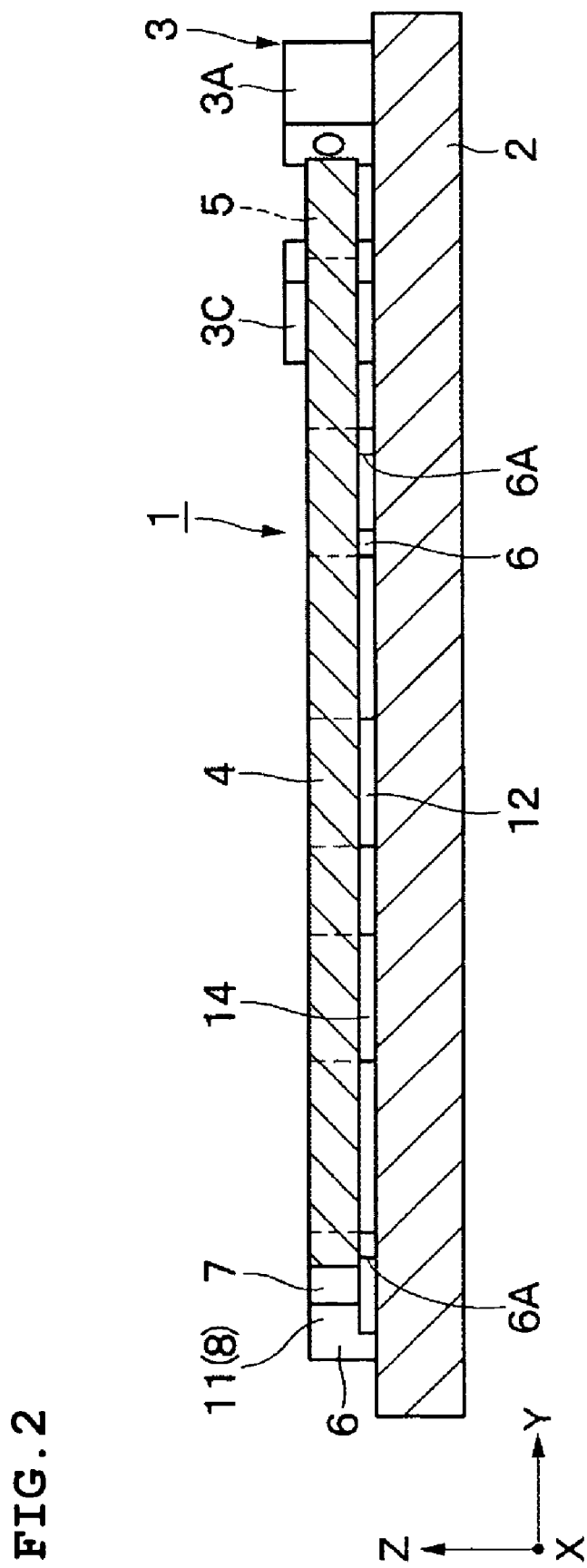
FIG. 2 is a cross-sectional view of the optical switch device taken along line II-II in FIG. 1.

Referring to FIGS. 1 and 2, the movable member 4 disposed above the substrate 2, for example, preferably has a thin rod-like body and extends linearly in the y-axis direction. Moreover, the movable member 4 is supported by the substrate 2 such that the movable member 4 is shiftable in the y-axis direction via the stationary members 6, the supporting beams 7, and the rotatable supporters 8. In this state, the movable member 4, the mirror 5, the supporting beams 7, and the rotatable supporters 8 are disposed above the substrate 2 in a non-contact manner such that these elements are distant from the substrate 2 in a direction that is substantially perpendicular to the substrate 2 (in the z-axis direction).

The movable member 4 is driven by either the electrodes 12 and 13 or the electrodes 14 and 15 so as to be shifted in a first direction (a direction indicated by an arrow A) along the y-axis or a second direction (a direction indicated by an arrow B) along the y-axis. Consequently, the position of the movable member 4 can be switched between a first switch position (shown in FIG. 1) in which the mirror 5 enters the optical paths, and a second switch position (shown in FIG. 5) in which the mirror 5 is shifted away from the optical paths.

The mirror 5 disposed on an end of the movable member 4 is, for example, composed of metal films formed on side surfaces of the movable member 4 by, for example, plating, vapor deposition, or sputtering. The mirror 5 is capable of moving toward and away from the optical paths of the optical unit 3.

When the movable member 4 is in the first switch position, the light beams in the optical unit 3 are reflected by the mirror 5 such that a light beam output from the emitter 3A is input to the receptor 3C, and a light beam output from the emitter 3B is input to the receptor 3D. On the other hand, when the movable member 4 is in the second switch position, the optical paths are switched such that a light beam output from the emitter 3A is input to the receptor 3D, and a light beam output from the emitter 3B is input to the receptor 3C.

There are, for example, four stationary members 6 on the substrate 2 for supporting the movable member 4. The four stationary members 6 are arranged in two pairs such that the stationary members 6 of each pair are disposed on the left and right sides (in the x-axis direction) while having the movable member 4 disposed therebetween. Moreover, the two pairs of the stationary members 6 are separated from each other in the vertical direction (in the y-axis direction) by a predetermined distance.

Figure 3:
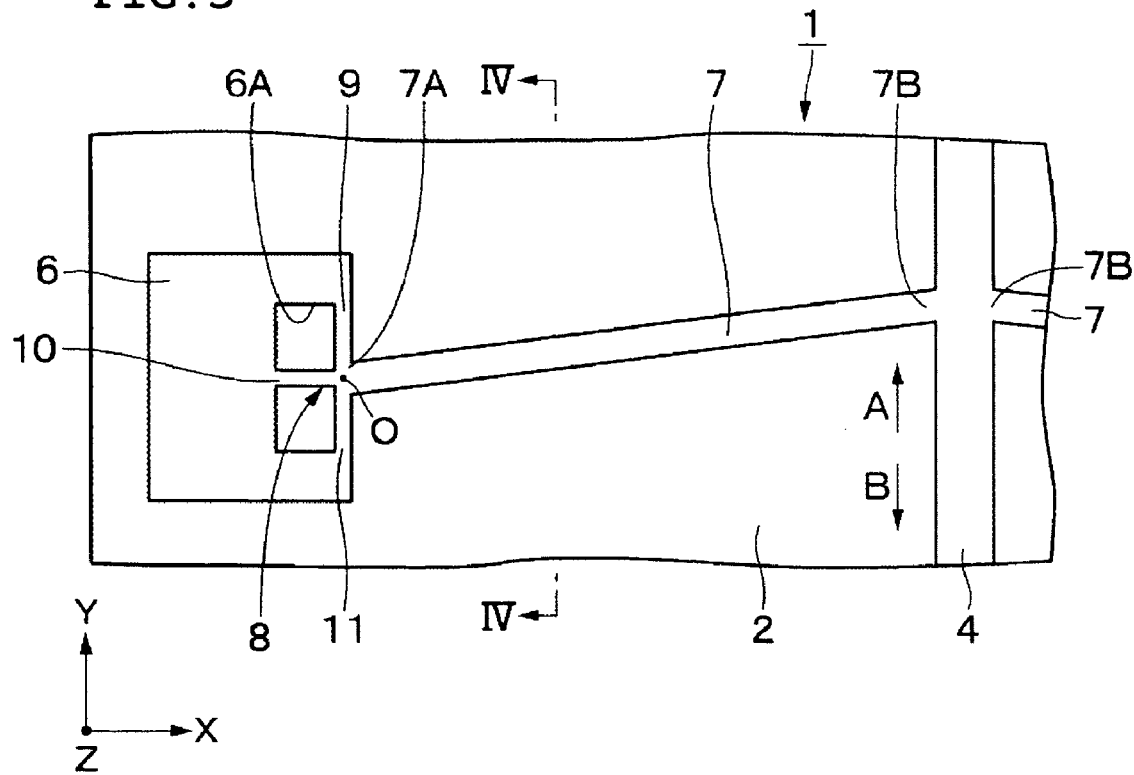
FIG. 3 is a partially-enlarged view of FIG. 1, in which one of stationary members, one of supporting beams, and one of rotatable supporters, for example, are illustrated.
Figure 4:
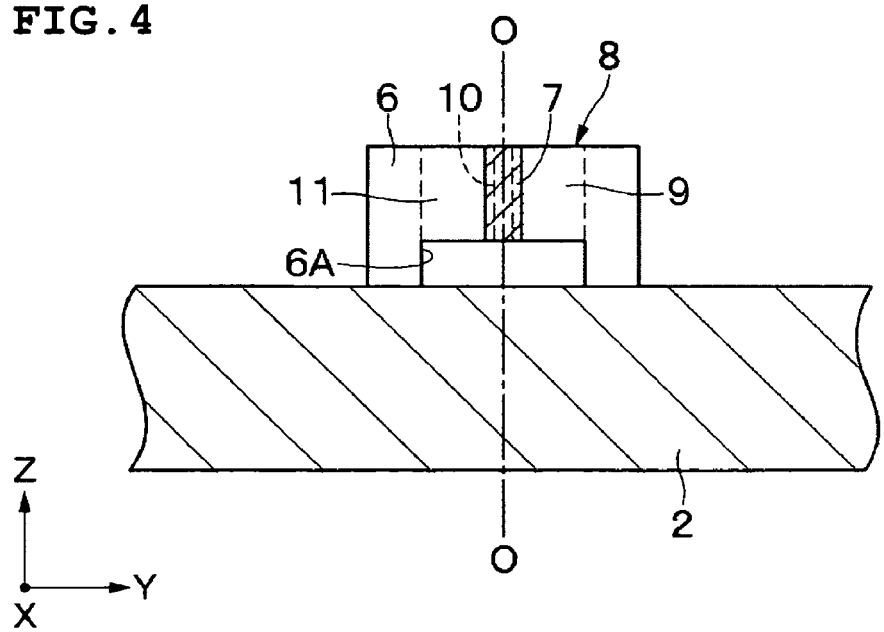
FIG. 4 is a partially-enlarged cross-sectional view taken along line IV-IV in FIG. 3.

Referring to FIGS. 3 and 4, each of the stationary members 6 is a substantially U-shaped projection projecting from the substrate 2. The inner portion of each stationary member 6 is provided with a substantially rectangular recess 6A having an opening which faces the movable member 4. Moreover, each of the stationary members 6 is connected with, for example, wires (not shown in the drawings) for supplying power to the movable electrodes 13 and 15 via the movable member 4.

Figure 5:
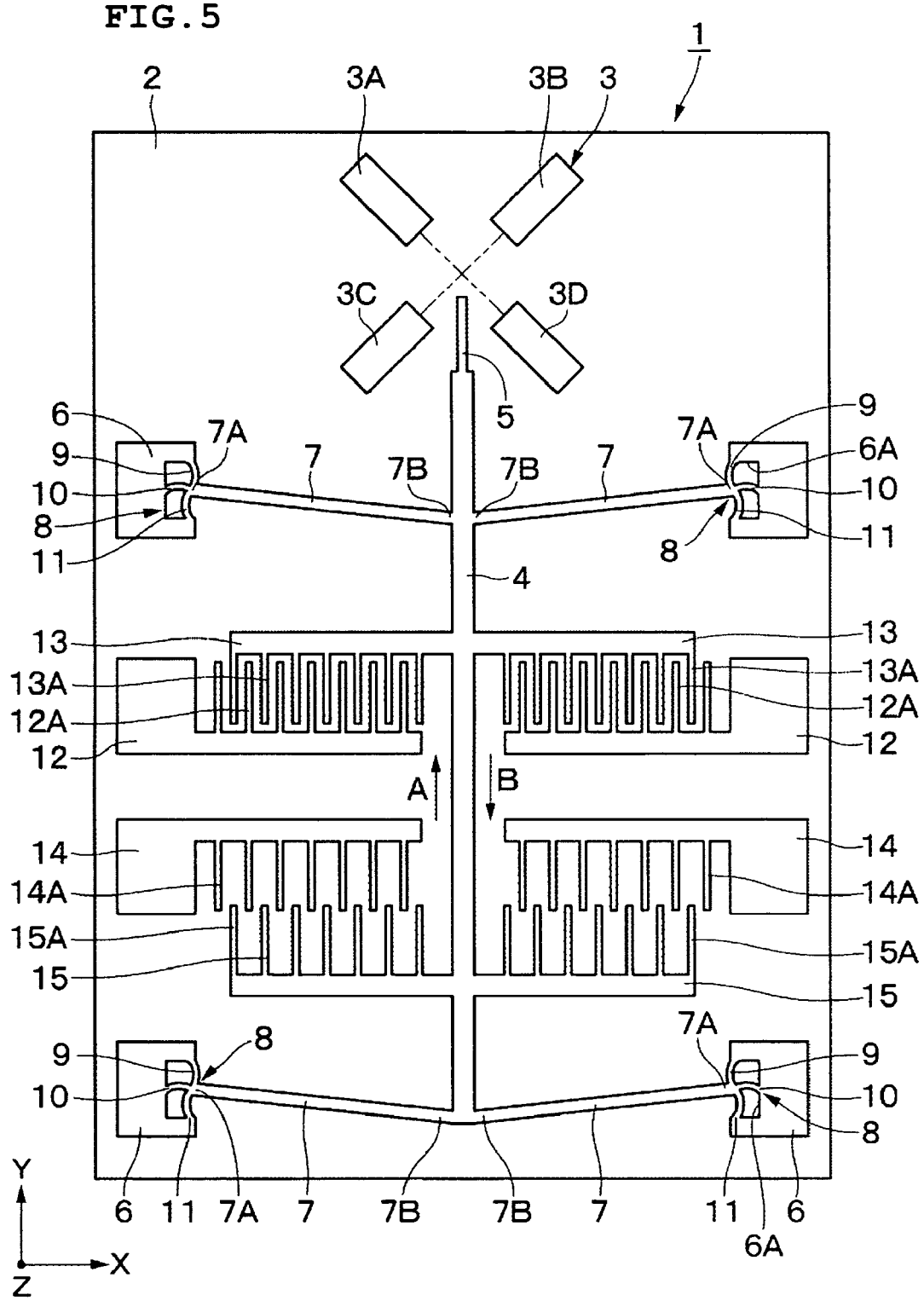
FIG. 5 is a front view of the optical switch device illustrating a state where a movable member and a mirror, for example, are shifted to a second switch position.
Figure 6:
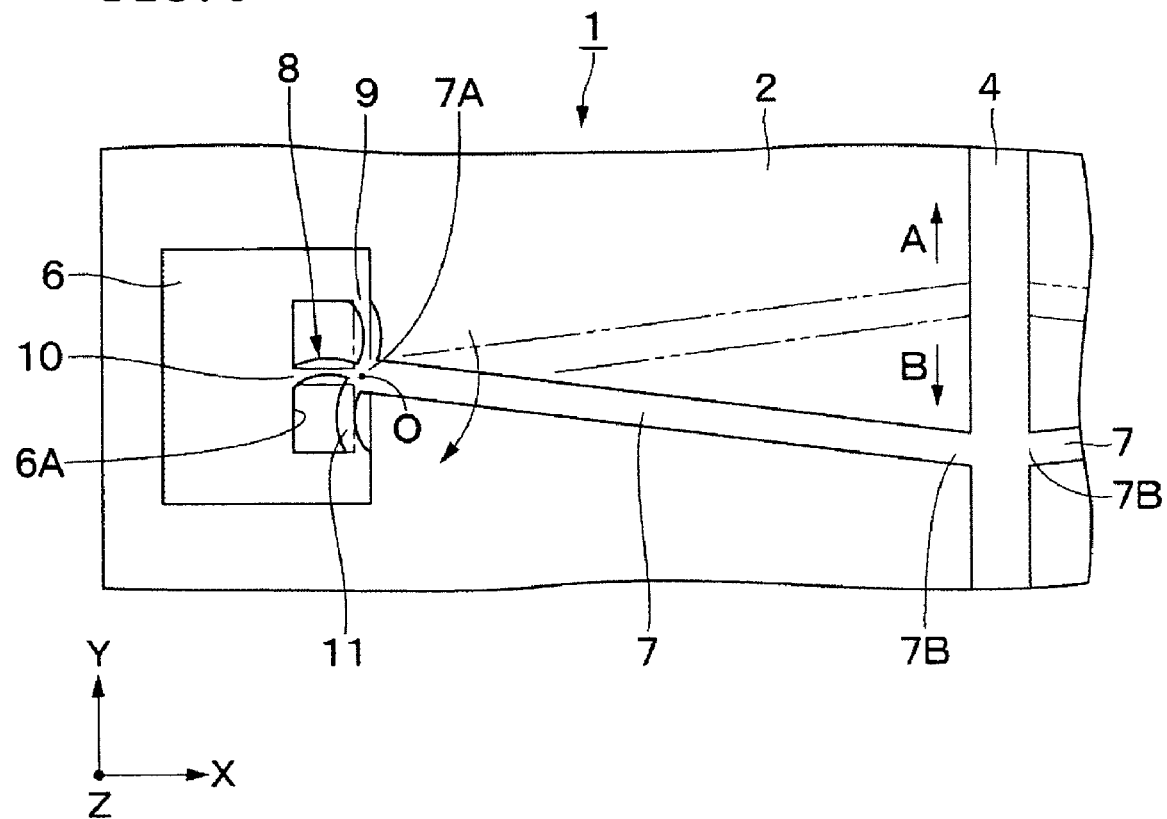
FIG. 6 is a partially-enlarged view of FIG. 5, in which one of the stationary members, one of the supporting beams, and one of the rotatable supporters, for example, are illustrated.

There are, for example, four supporting beams 7 each provided between the movable member 4 and the corresponding one of the stationary members 6. Referring to FIGS. 1 and 5, each of the supporting beams 7 extends in a direction that is not perpendicular to the shifting direction of the movable member 4 (for example, at an angle with respect to the x-axis and the y-axis). Moreover, the four supporting beams 7 are arranged in two pairs such that the supporting beams 7 of each pair are disposed on the opposite sides in the x-axis direction while having the movable member 4 disposed therebetween. Moreover, the two pairs of the supporting beams 7 are separated from each other in the y-axis direction by a predetermined distance. Accordingly, the four supporting beams 7 support the movable member 4 at four sections in a shiftable manner in the y-axis direction.

Each of the supporting beams 7 has an end 7A at its base portion, which is connected with the corresponding stationary member 6 via the corresponding rotatable supporter 8, and also has an end 7B at its front portion, which is connected with the movable member 4. Furthermore, each supporting beam 7 can be buckled (is bendable) between the movable member 4 and the corresponding stationary member 6, such that the ends 7A and 7B can be bent in the y-axis direction with respect to the stationary member 6 (rotatable supporter 8) and the movable member 4, respectively.

Referring to FIG. 1, when the movable member 4 is in the first switch position, the supporting beams 7 extend at an angle towards the first switch position (in the direction of the arrow A). In this case, the supporting beams 7 are in an initial state where, for example, they are not bent or that the ends 7A and 7B are not bent. On the other hand, referring to FIG. 5, when the movable member 4 is shifted to the second switch position, the ends 7A and 7B of each supporting beam 7 are bent so that the supporting beam 7 extends at an angle towards the second switch position (in the direction of the arrow B).

Figure 7:
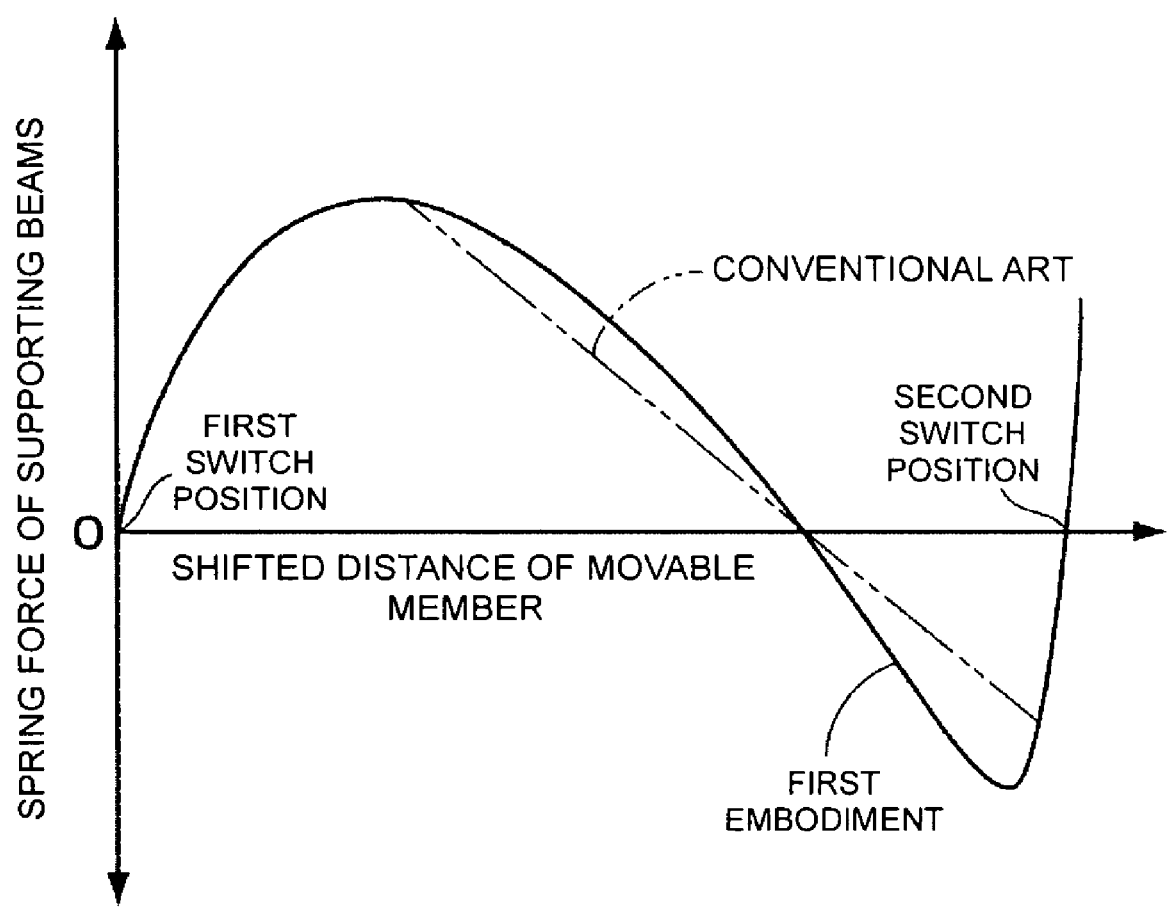
FIG. 7 illustrates the relationship between a shifted distance of the movable member and a spring force of the supporting beams.

In this case, referring to FIG. 7, a resilient force (spring force) applied to the movable member 4 from the supporting beams 7 changes as the movable member 4 is shifted from the first switch position to the second switch position. In detail, the supporting beams 7 bias the movable member 4 towards the first switch position (in the direction of the arrow A) until the movable member 4 reaches a midpoint of its shifting process. As the movable member 4 approaches the second switch position, the biasing force of the supporting beams 7 changes so as to bias the movable member 4 towards the second switch position (in the direction of the arrow B).

Consequently, when the movable member 4 is positioned at either the first or second switch position, the spring force of the supporting beams 7 holds the movable member 4 at its corresponding switch position. This achieves an optical switch device 1 of a self-holding type that can hold the movable member 4 at its desired switch position even when power is not being supplied to, for example, the electrodes 12 to 15.

There are, for example, four rotatable supporters 8 each provided between the recess 6A of the corresponding stationary member 6 and the end 7A of the corresponding supporting beam 7. Referring to FIGS. 3 and 4, each rotatable supporter 8 includes, for example, three bendable arm portions 9, 10, and 11 defining connecting sections between the corresponding stationary member 6 and the corresponding supporting beam 7. Each set of the arm portions 9, 10, and 11 forms a substantially T-shape, and is disposed between the recess 6A of the corresponding stationary member 6 and the end 7A of the corresponding supporting beam 7. Moreover, each set of the arm portions 9, 10, and 11 supports the corresponding supporting beam 7 in a rotatable manner about an axis line O-O (center of rotation O) extending in the z-axis direction.

The arm portions 9 to 11 of each set extend from the end 7A of the corresponding supporting beam 7 in directions that are different from one another, such that the arm portions 9 to 11 extend away from the center of rotation O disposed in the end 7A in a radial fashion. Of the three arm portions 9 to 11 in FIG. 3, the two arm portions 9 and 11 extend linearly along the y-axis in opposite directions.

The arm portion 10 extends linearly along the x-axis, that is, in the direction that is substantially perpendicular to the shifting direction of the movable member 4. The arm portion 10 restricts the movement of the movable member 4 via the supporting beam 7 so that the movable member 4 can move only in the y-axis direction. Thus, the restricting function of each arm portion 10 prevents the movable member 4 and the mirror 5 from being displaced in the x-axis direction (the width direction of the movable member 4) so as to achieve a stable shifting of the movable member 4 in the y-axis direction.

Referring to FIG. 3, when the movable member 4 is in the first switch position, the arm portions 9 to 11 are maintained in an initial state in which they are not bent. On the other hand, referring to FIG. 6, when the movable member 4 is being shifted towards the second switch position, the arm portions 9 to 11 of each rotatable supporter 8 are bent to become arc-shaped as the end 7A of the corresponding supporting beam 7 is bent in the direction of the arrow B with respect to the rotatable supporter 8. Thus, each of the supporting beams 7 can rotate around the center of rotation O even if the end 7A is not bent by a significant amount.

Accordingly, each rotatable supporter 8 reduces the amount of reaction force (rotational binding force) from the corresponding stationary member 6 when the end 7A of the corresponding supporting beam 7 is bent. This allows the movable member 4 to be held stably at the second switch position.

The electrode 12 defines a first stationary electrode disposed above the substrate 2 and includes electrode components disposed on the left and right sides of the movable member 4. The electrode 13 defines a first movable electrode provided in the movable member 4 and facing the stationary electrode 12. The stationary electrode 12 and the movable electrode 13 have a comb-like structure and respectively have a plurality of electrode plates 12A and 13A. Thus, the stationary electrode 12 and the movable electrode 13 mesh with each other in a non-contact manner via the electrode plates 12A and 13A.

The first stationary electrode 12 and the first movable electrode 13 receive power from an external source and generate an electrostatic force in the y-axis direction (in the direction of the arrow A) between the electrode plates 12A and the electrode plates 13A. This shifts the movable member 4 towards the first switch position.

On the other hand, the electrode 14 defines a second stationary electrode including electrode components disposed on the left and right sides of the substrate 2, and the electrode 15 defines a second movable electrode provided in the movable member 4 and facing the stationary electrode 14. The second stationary electrode 14 and the second movable electrode 15 are substantially similar to the first stationary electrode 12 and the first movable electrode 13 in having a plurality of electrode plates 14A and 15A, respectively, which mesh with each other, but are different in that the positioning of the second stationary electrode 14 and the second movable electrode 15 is opposite to that of the first stationary electrode 12 and the first movable electrode 13 with respect to the y-axis direction. Moreover, the second stationary electrode 14 and the second movable electrode 15 can generate an electrostatic force between the electrode plates 14A and the electrode plates 15A such that the movable member 4 can be shifted towards the second switch position.

Figure 8:
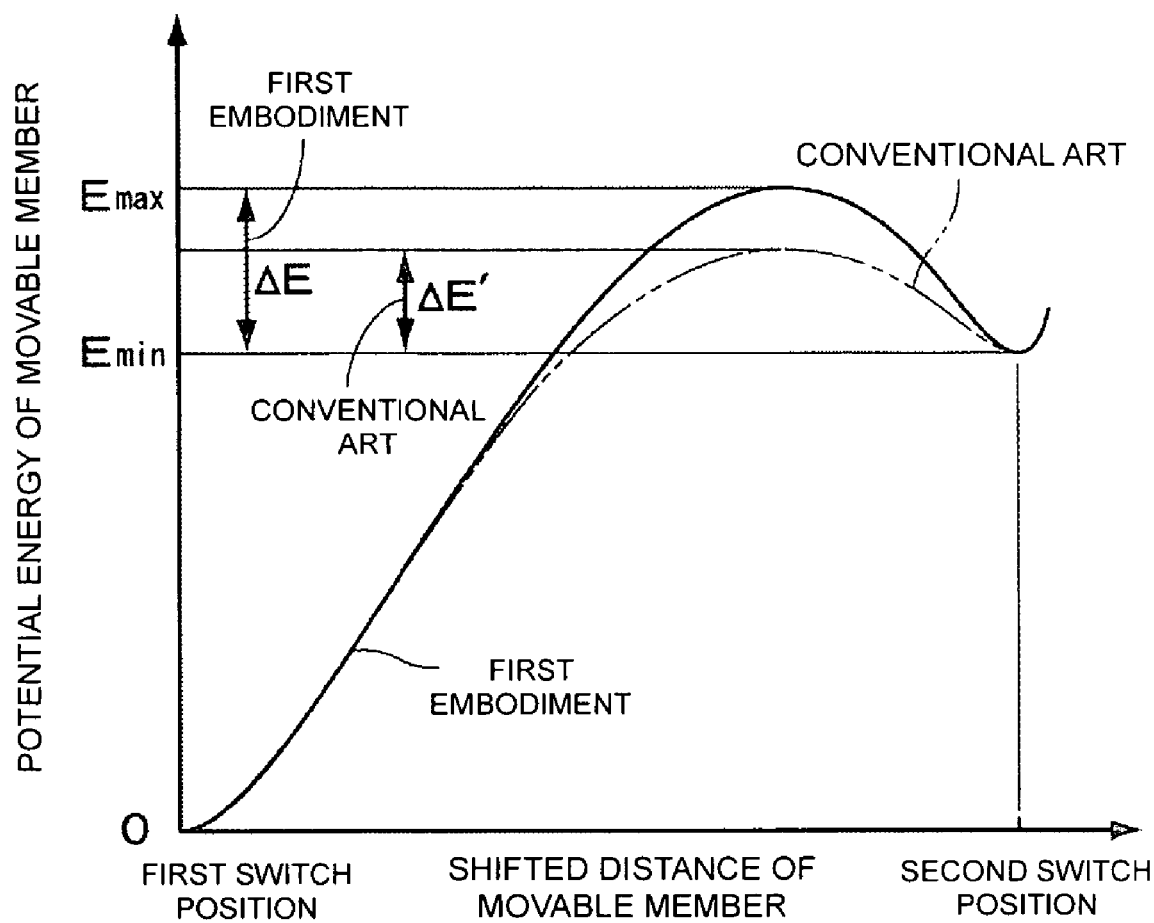
FIG. 8 illustrates the relationship between the shifted distance of the movable member and a potential energy of the movable member.

Referring to FIGS. 7 and 8, the relationship among, for example, the shifted distance of the movable member 4, the potential energy, and the spring force of the supporting beams 7 will now be described. In these drawings, the first switch position is set as the reference (zero) for the shifted distance of the movable member 4 and the potential energy. Moreover, the spring force of the supporting beams 7 in the direction of the arrow A in FIG. 1 is defined as positive, whereas the spring force in the direction of the arrow B is defined as negative.

When the movable member 4 is shifted from the first switch position to the second switch position, the supporting beams 7 buckled at an angle in the direction of the arrow A become bent at an angle in the direction of the arrow B. Thus, referring to FIG. 7, the spring force of the supporting beams 7 is first applied to the movable member 4 in the positive direction, but is subsequently applied in the negative direction from the midpoint of the shifting process of the movable member 4. The spring force then reaches a minimum value at the second switch position (i.e. a maximum value in the direction of the arrow B).

In this case, referring to FIG. 8, the potential energy of the movable member 4 increases as the spring force increases so as to reach a maximum value $E_{max}$ at a midpoint of the shifting process. Subsequently, as the spring force decreases, the potential energy also decreases so as to reach a minimum value $E_{min}$, which is smaller than the maximum value $E_{max}$, at the second switch position.

Accordingly, a barrier $\Delta E$ (delta E) of potential energy, which is represented by Equation 1 below and corresponds to the difference between the maximum value $E_{max}$ and the minimum value $E_{min}$, is present between the first switch position and the second switch position. Thus, the movable member 4 cannot move back towards the first switch position unless the electrostatic force generated between the electrodes 12 and 13 overcomes the barrier $\Delta E$ to exceed the spring force of the supporting beams 7. Consequently, this allows the movable member 4 to be stably maintained at the second switch position.

$$\Delta E = E_{max} - E_{min} \qquad \text{Equation 1}$$

On the other hand, when the movable member 4 is shifted from the first switch position to the second switch position, the ends 7A of the supporting beams 7 are bent in the direction of the arrow B. Since the rotatable supporters 8 are capable of rotating the ends 7A, the reaction force (rotational binding force) generated by the bending of the ends 7A can be reduced.

For example, in comparison with a result of a conventional device shown with a double-dashed line in FIG. 7, the first preferred embodiment of the present invention has a larger area in which the spring force of the supporting beams 7 becomes negative when the movable member 4 is being shifted. Consequently, in comparison with a barrier $\Delta E'$ of potential energy according to a conventional device shown with a double-dashed line in FIG. 8, for example, the barrier $\Delta E$ of potential energy according to the first preferred embodiment of the present invention is made sufficiently greater so that the movable member 4 can be stably maintained at the second switch position.

The optical switch device 1 according to the first preferred embodiment preferably has the structure mentioned above and operates in the following manner.

If a direct-current voltage is applied between the second stationary electrode 14 and the second movable electrode 15 when the movable member 4 is in the first switch position, an electrostatic force is generated in the y-axis direction between the second stationary electrode 14 and the second movable electrode 15. The electrostatic force moves the movable member 4 in the direction of the arrow B against the spring force of the supporting beams 7. When the movable member 4 is moved by a certain amount and the spring force of the supporting beams 7 changes direction to the direction of the arrow B, the movable member 4 overcomes the barrier $\Delta E$ of the potential energy so as to reach the second switch position.

Thus, the movable member 4 is in a state where it is pressed by the spring force of the supporting beams 7 at the second switch position. In this case, because the supporting beams 7 and the rotatable supporters 8 provide the large barrier $\Delta E$ of potential energy between the first switch position and the second switch position, even when electric power is not supplied to the electrodes 14 and 15, the movable member 4 can be stably maintained at the second switch position against an external force, such as an impact. Consequently, the optical paths of the optical unit 3 can be switched smoothly.

On the other hand, if a direct-current voltage is applied between the first stationary electrode 12 and the first movable electrode 13 when the movable member 4 is in the second switch position, an electrostatic force is generated between the electrodes 12 and 13. The electrostatic force thus moves the movable member 4 in the direction of the arrow A against the spring force of the supporting beams 7. When the movable member 4 overcomes the barrier $\Delta E$ of potential energy, the movable member 4 returns to the first switch position.

Thus, the movable member 4 reaches an initial state where the potential energy according to the spring force of the supporting beams 7 is at a minimum. For this reason, if the movable member 4 is moved even slightly in the direction of the arrow B, the movable member 4 receives an opposing spring force from the supporting beams 7. Thus, even if electric power is not supplied to the electrodes 12 and 13, the movable member 4 can be stably maintained at the first switch position.

Because the arm portions 10 of the rotatable supporters 8 restrict the displacement of elements, such as the movable member 4, the mirror 5, and the movable electrodes 13 and 15, in the x-axis direction, these elements can be stably shifted in the y-axis direction during the switching operation even if the substrate 2 receives, for example, vibration.

In the first preferred embodiment, because the rotatable supporters 8 for rotatably supporting the ends 7A of the supporting beams 7 define the connecting sections between the stationary members 6 and the supporting beams 7, the supporting beams 7 can be smoothly rotated around the axis line O-O for shifting the movable member 4 without having to bend the ends 7A of the supporting beams 7 by a significant amount.

Accordingly, since the bending of the supporting beams 7 can be compensated for by the rotatable supporters 8, the ends 7A do not need to be bent by a significant amount. This reduces the reaction force (rotational binding force) applied to the supporting beams 7 during the bending process. As a result, this provides a larger area in which the spring force of the supporting beams 7 is negative in the second switch position, and moreover, provides a sufficiently large barrier $\Delta E$ of potential energy between the switch positions.

Accordingly, even if electric power is not supplied to the electrodes 12 to 15, the movable member 4 can be stably maintained at the desired switch position with the spring force of the supporting beams 7. This prevents the movable member 4 from being undesirably switched between the switch positions due to an external force, such as an impact and vibration, and moreover, prevents, for example, improper operation of the optical switch device 1 so as to improve the reliability of the optical switch device 1.

Furthermore, since the arm portions 10, for example, extend in the x-axis direction, which is substantially perpendicular to the shifting direction of the movable member 4, the arm portions 10 prevent the movable member 4 and the mirror 5 from being displaced in the x-axis direction, and moreover, prevent the movable electrodes 13 and 15 from coming into contact with the stationary electrodes 12 and 14 when the movable member 4 is being driven between the switch positions. This allows the optical switch device 1 to operate in a stable manner.

Moreover, according to the simple T-shaped structure of the three arm portions 9, 10, and 11 of each of the rotatable supporters 8, each supporting beam 7 can be smoothly rotated and the movable member 4 is prevented from being dislocated. Accordingly, this achieves a simplified supporting structure.

Furthermore, as described above, the movable member 4 can be shifted with an electrostatic force. In order to achieve this, the electrodes 12, 13, 14, and 15 having a comb-like structure may be formed of, for example, the same material as the movable member 4 so that the electrostatic force for moving the movable member 4 can be generated in the electrodes 12, 13, 14, and 15. Thus, the movable member 4 can be driven with a simple structure.

Furthermore, since the movable member 4, the stationary members 6, the supporting beams 7, the rotatable supporters 8, and the electrodes 12, 13, 14, and 15, for example, are formed of a single-crystal silicon material, the fine structures of such elements can be efficiently fabricated in the same process so as to improve the degree of precision.

Figure 9:
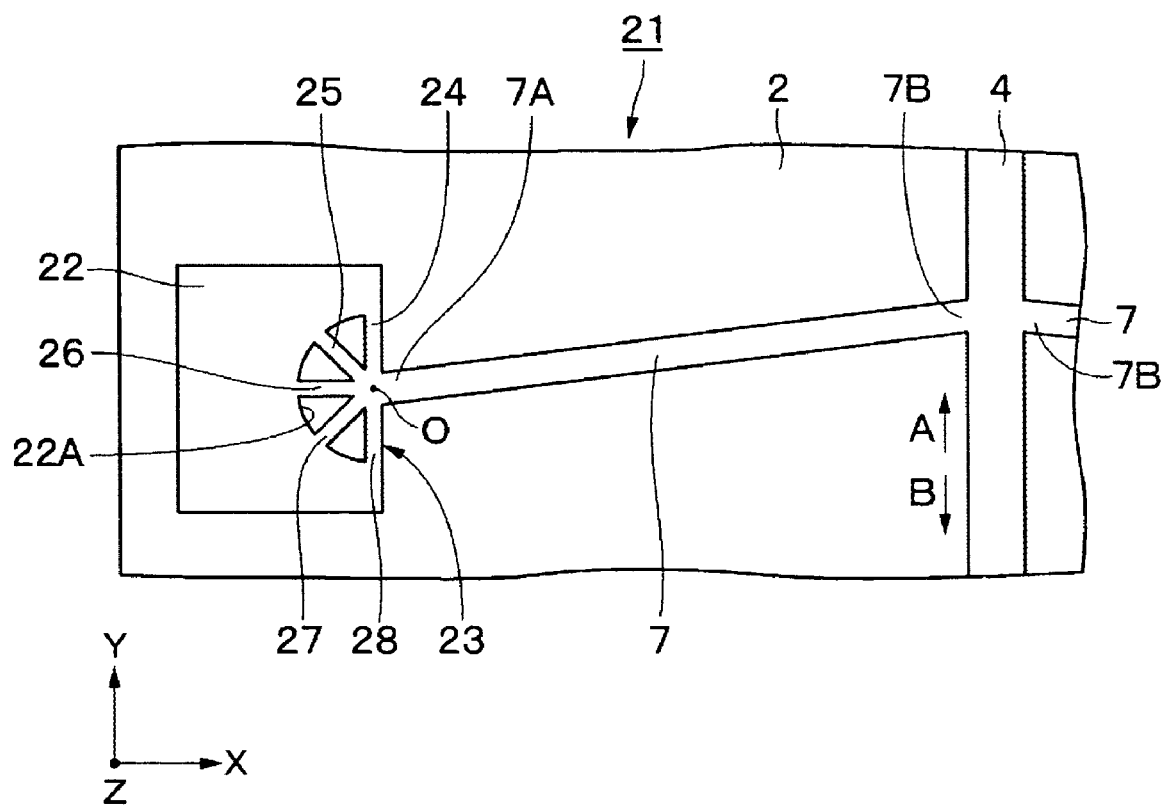
FIG. 9 is a partially-enlarged view of an optical switch device according to a second preferred embodiment of the present invention viewed from the same angle as FIG. 3.

FIG. 9 illustrates a second preferred embodiment of the present invention. According to the second preferred embodiment, each rotatable supporter includes at least four arm portions extending away from one another in a radial fashion. In the second preferred embodiment, components equivalent to those in the first preferred embodiment are indicated by the same reference numerals, and descriptions of those components will thus be omitted.

Reference numeral 21 indicates an optical switch device. Similar to the first preferred embodiment, the optical switch device preferably 21 includes the substrate 2, the movable member 4, the supporting beams 7, the electrodes (not shown in the drawings), stationary members 22, and rotatable supporters 23.

There are, for example, four stationary members 22 (one of which is shown in the drawing) projecting from the substrate 2 to support the movable member 4. Similar to the first preferred embodiment, each of the stationary members 22 is provided with a semi-circular recess 22A having an opening which faces the movable member 4.

Each of the rotatable supporters 23 is disposed between the recess 22A of the corresponding stationary member 22 and the end 7A of the corresponding supporting beam 7. Similar to the first preferred embodiment, the rotatable supporters 23 define the connecting sections between the stationary members 22 and the supporting beams 7. Each rotatable supporter 23 supports the corresponding supporting beam 7 in a rotatable manner about the axis line O-O (center of rotation O) extending in the z-axis direction.

Each of the rotatable supporters 23 includes, for example, at least four arm portions which are bendable. FIG. 5 illustrates an example in which five arm portions 24, 25, 26, 27, and 28 are provided. These arm portions 24 to 28 extend from the end 7A of the corresponding supporting beam 7 in directions different from one another, such that the arm portions 24 to 28 extend away from the center of rotation O disposed in the end 7A in a radial fashion. Moreover, the arm portions 24 to 28 are disposed between the recess 6A of the corresponding stationary member 6 and the end 7A of the corresponding supporting beam 7.

Of the arm portions 24 to 28 shown in FIG. 9, the two arm portions 24 and 28 positioned above and below the supporting beam 7 extend linearly along the y-axis. On the other hand, the arm portion 26 positioned on the left extends linearly in the x-axis direction, which is substantially perpendicular to the shifting direction of the movable member 4. The arm portions 25 and 27 extend at an angle with respect to the x-axis. Thus, the arm portions 25, 26, and 27 prevent the movable member 4 and the supporting beam 7 from moving in the x-axis direction.

Similar to the first preferred embodiment, when the movable member 4 is shifted from the first switch position to the second switch position, the arm portions 24 to 28 of each rotatable supporter 23 are bent to become arc-shaped. Thus, each of the supporting beams 7 can rotate around the center of rotation O even if the end 7A of the supporting beam 7 is not bent by a significant amount.

The second preferred embodiment achieves substantially the same effect and advantages as the first preferred embodiment. Specifically, in the second preferred embodiment, because the arm portions 24, 25, 26, 27, and 28 are disposed in a radial fashion in each rotatable supporter 23, a required number of arm portions 24 to 28 surrounds the center of rotation O in a radial fashion. This provides sufficient strength for each rotatable supporter 23. Moreover, the arm portions 24 to 28 stably support each supporting beam 7, and smoothly rotate the supporting beam 7 around the center of rotation O.

Figure 10:
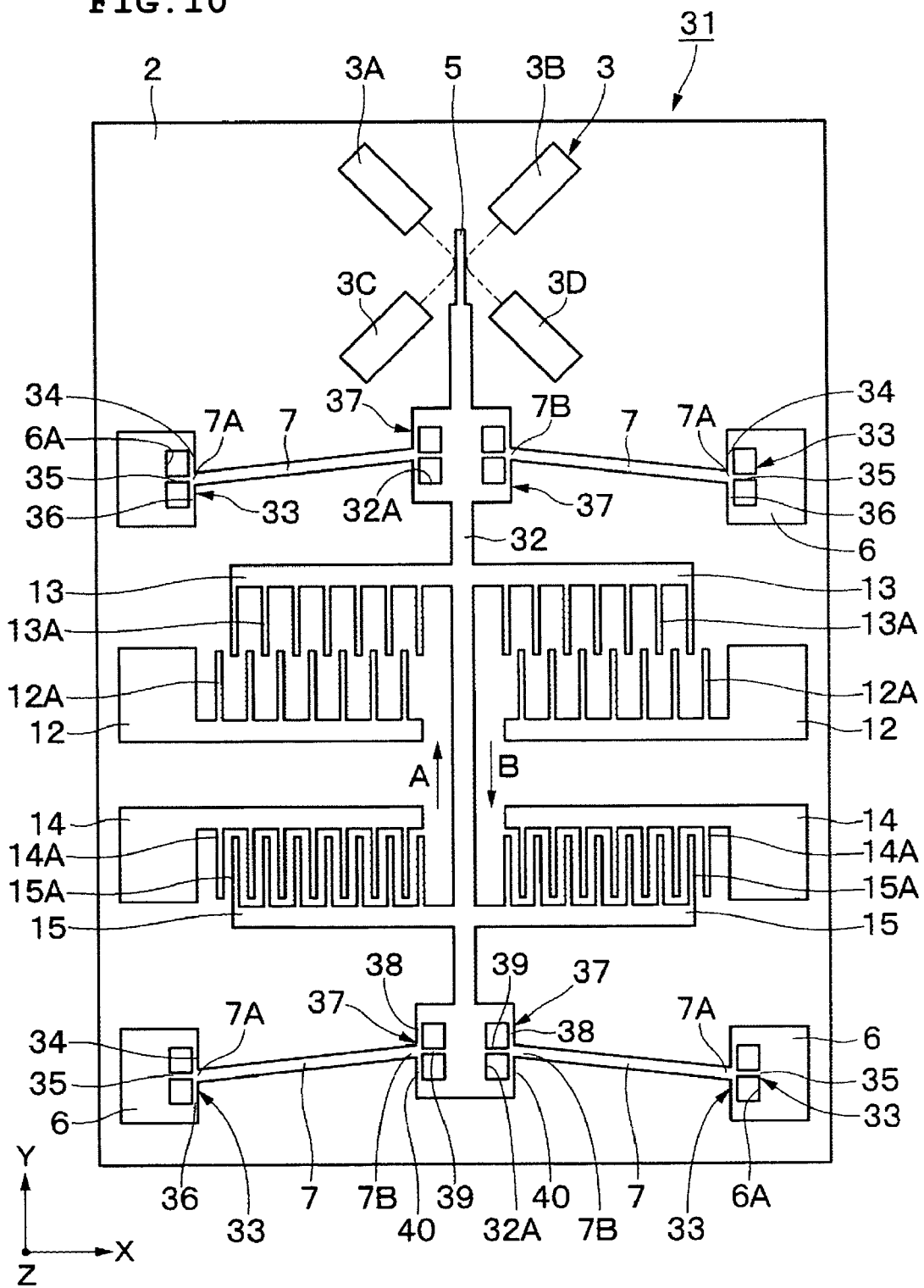
FIG. 10 is a front view of an optical switch device according to a third preferred embodiment of the present invention.
Figure 11:
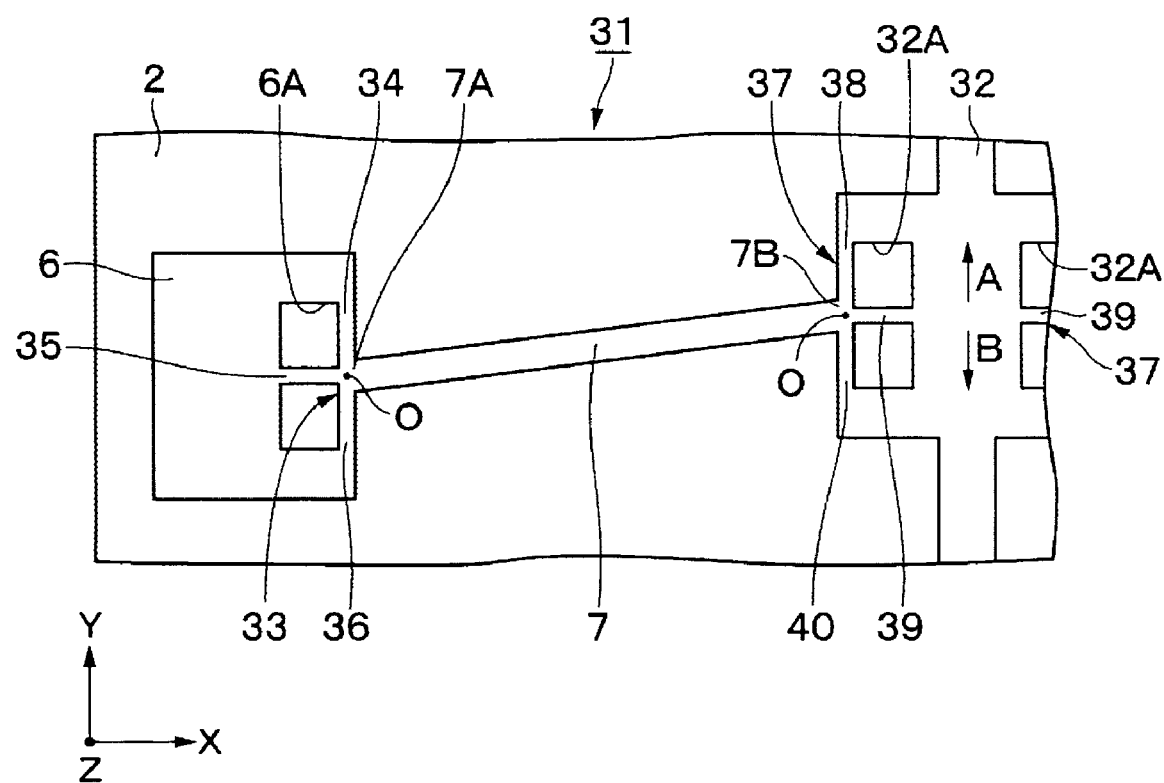
FIG. 11 is a partially-enlarged view of FIG. 10, in which one of the stationary members, one of the supporting beams, and rotatable supporters, for example, are illustrated.

FIGS. 10 and 11 illustrate a third preferred embodiment of the present invention. According to the third preferred embodiment, the rotatable supporters are provided in both the stationary members and the movable member such that both ends of each supporting beam are supported by the corresponding rotatable supporters. In the third preferred embodiment, components equivalent to those in the first preferred embodiment are indicated by the same reference numerals, and descriptions of those components will thus be omitted.

Reference numeral 31 indicates an optical switch device. Similar to the first preferred embodiment, the optical switch device 31 includes the substrate 2, the stationary members 6, the supporting beams 7, the electrodes 12 to 15, and a movable member 32. Both ends of each supporting beam 7 are respectively provided with rotatable supporters 33 and 37.

The movable member 32 is disposed above the substrate 2 and has a rod-like structure. Similar to the first preferred embodiment, an end of the movable member 32 is provided with the mirror 5. The movable member 32 is disposed above the substrate 2 in a shiftable manner in the y-axis direction via the stationary members 6, the supporting beams 7, and the rotatable supporters 33 and 37. Moreover, four sections of the movable member 32 connected with the supporting beams 7 are made wider in the x-axis direction in comparison with those of the first preferred embodiment. Each of the four sections is provided with a recess 32A.

Each reference numeral 33 indicates, for example, one of four substrate rotatable-supporters disposed between the recess 6A of the corresponding stationary member 6 and the end 7A of the corresponding supporting beam 7. Similar to the rotatable supporters 8 in the first preferred embodiment, each substrate rotatable-supporter 33 defines the connecting section between the corresponding stationary member 6 and the corresponding supporting beam 7. Moreover, each substrate rotatable-supporter 33 is provided with, for example, a set of three bendable arm portions 34, 35, and 36 forming a substantially T-shape. Each set of the arm portions 34, 35, and 36 supports the end 7A of the corresponding supporting beam 7 in a rotatable manner about the axis line O-O (center of rotation O).

Each reference numeral 37 indicates, for example, one of four movable-member rotatable supporters disposed between the corresponding recess 32A of the movable member 32 and the end 7B of the corresponding supporting beam 7. Similar to the substrate rotatable-supporters 33, referring to FIG. 11, each of the movable-member rotatable supporters 37 is provided with, for example, a set of three bendable arm portions 38, 39, and 40 forming a substantially T-shape. Moreover, each movable-member rotatable supporter 37 defines the connecting section between the movable member 32 and the corresponding supporting beam 7, and supports the end 7B of the supporting beam 7 in a rotatable manner about an axis line (center of rotation O') extending in the z-axis direction.

The arm portions 38, 39, and 40 of each set extend from the end 7B of the corresponding supporting beam 7 in different directions, such that the arm portions 38, 39, and 40 extend away from the center of rotation O' disposed in the end 7B in a radial fashion. Moreover, the arm portions 38, 39, and 40 are disposed between the corresponding recess 32A of the movable member 32 and the end 7B of the corresponding supporting beam 7. Of the three arm portions 38 to 40 shown in FIG. 11, the arm portion 39 on the left extends linearly in the x-axis direction so as to prevent the movable member 32 and the supporting beam 7 from moving in the x-axis direction.

When the movable member 4 is shifted from the first switch position to the second switch position, the arm portions 34 to 36 of each substrate rotatable-supporter 33 rotate the end 7A of the corresponding supporting beam 7 around the center of rotation O, and the arm portions 38 to 40 of each movable-member rotatable supporter 37 rotate the end 7B of the corresponding supporting beam 7 around the center of rotation O'. This reduces the reaction force applied to the ends 7A and 7B when the ends 7A and 7B are bent.

The third preferred embodiment achieves substantially the same effect and advantages as the first preferred embodiment. Specifically, in the third preferred embodiment, because the substrate rotatable-supporters 33 define the connecting sections between the stationary members 6 and the supporting beams 7, and the movable-member rotatable supporters 37 define the connecting sections between the movable member 32 and the supporting beams 7, the ends 7A and 7B of the supporting beams 7 can be rotatably supported by the respective rotatable supporters 33 and 37.

Accordingly, since the reaction force (rotational binding force) applied to the movable member 32 from the supporting beams 7 during the bending process can further be reduced, the barrier $\Delta E$ of potential energy between the first switch position and the second switch position can be set to be much greater. This provides a stable switching operation for the optical switch device 31.

Figure 12:
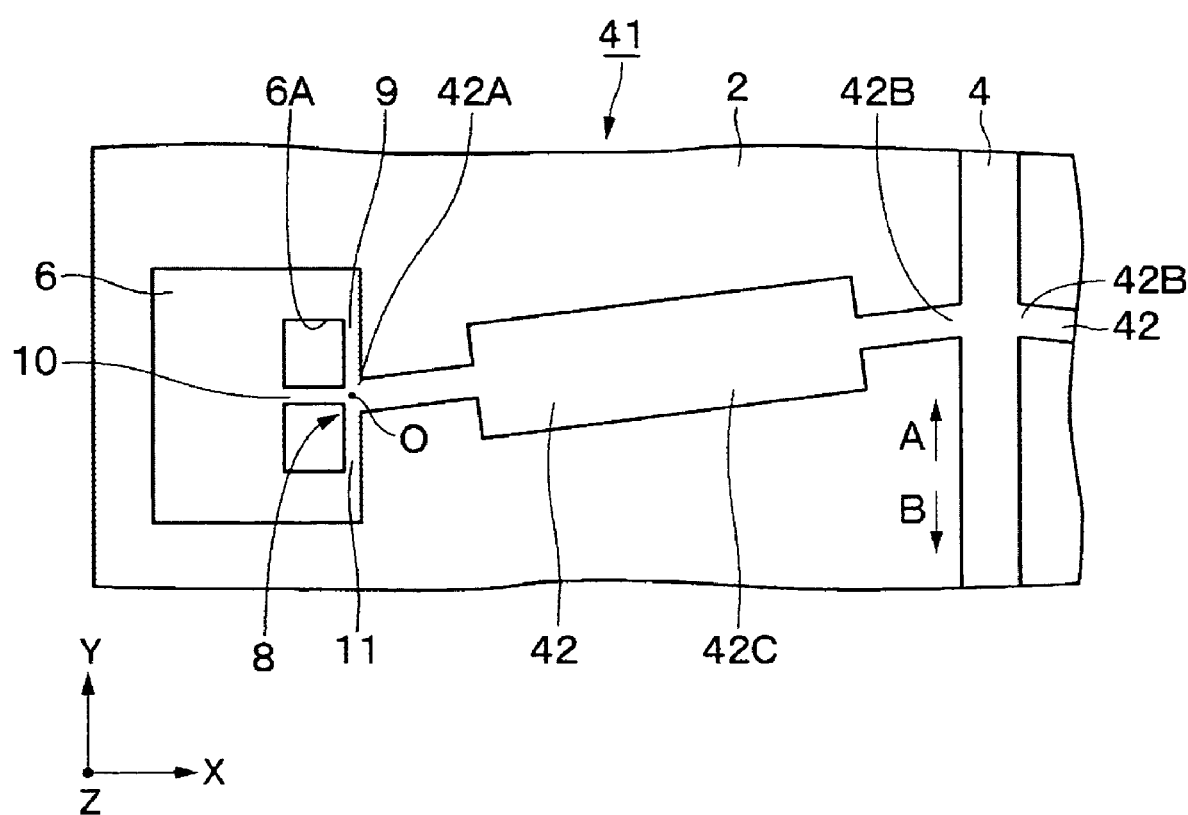
FIG. 12 is a partially-enlarged view of an optical switch device according to a fourth preferred embodiment of the present invention.
Figure 13:
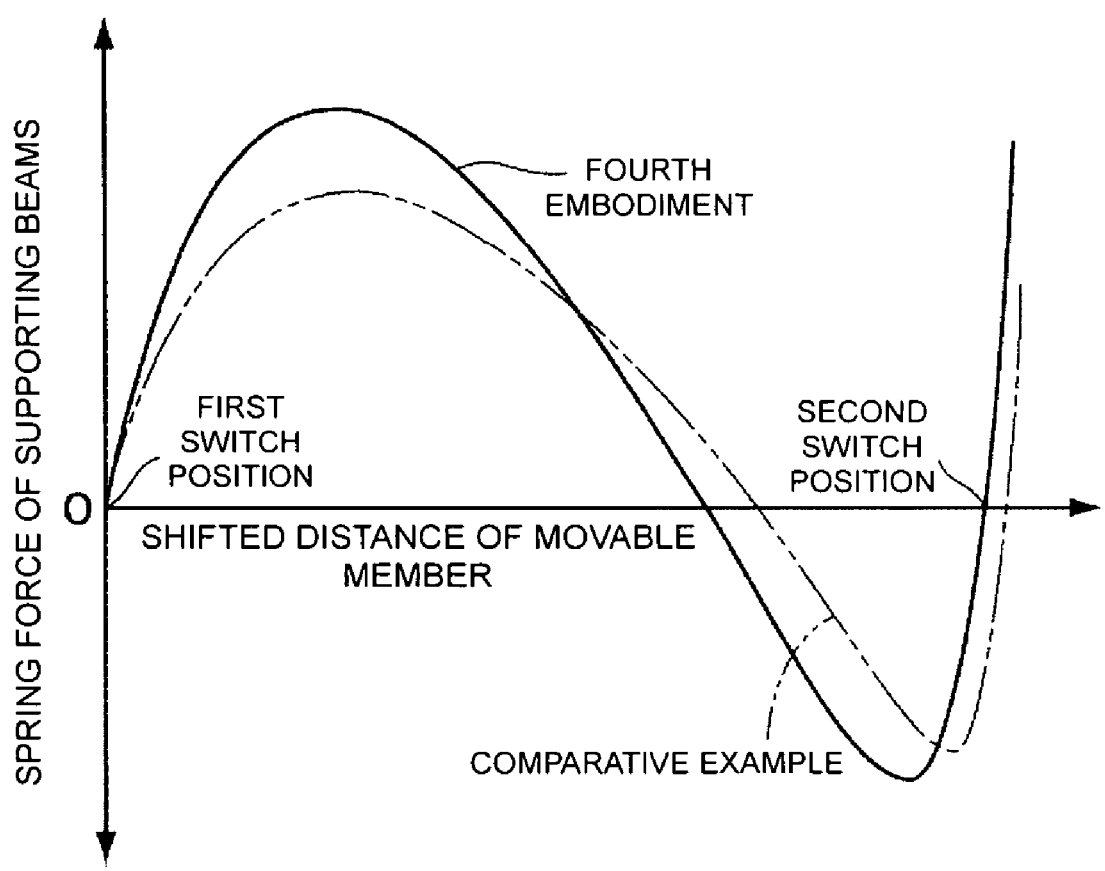
FIG. 13 illustrates the relationship between the shifted distance of the movable member and the spring force of the supporting beams.
Figure 14:
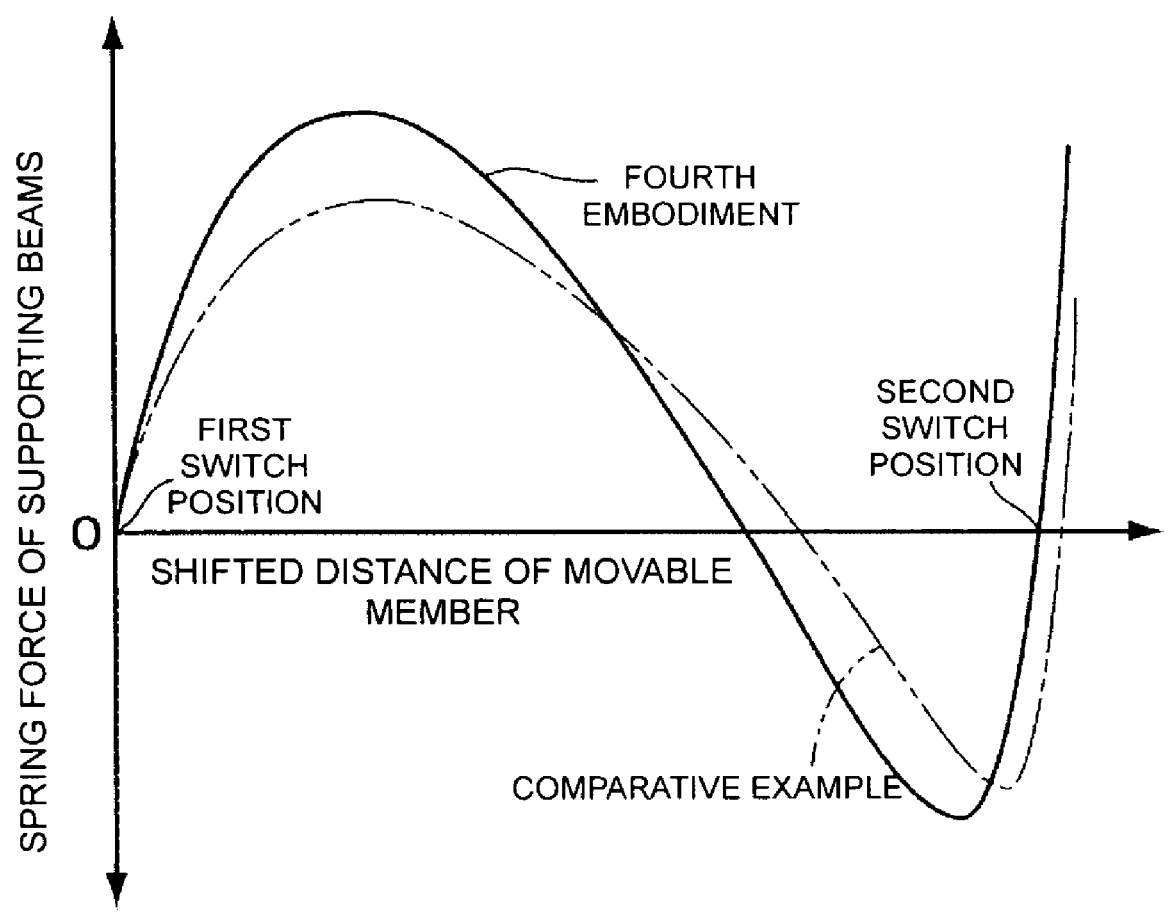
FIG. 14 illustrates the relationship between the shifted distance of the movable member and the potential energy of the movable member.

FIGS. 12 to 14 illustrate a fourth preferred embodiment of the present invention. According to the fourth preferred embodiment, each supporting beam is preferably provided with a reinforcing portion at the midsection of the supporting beam in the longitudinal direction. In the fourth preferred embodiment, components equivalent to those in the first preferred embodiment are indicated by the same reference numerals, and descriptions of those components will thus be omitted.

Reference numeral 41 indicates an optical switch device. Similar to the first preferred embodiment, the optical switch device 41 includes the substrate 2, the movable member 4, the stationary members 6, the rotatable supporters 8, the electrodes (not shown in the drawings), and supporting beams 42.

There are, for example, four supporting beams 42 (two of which are shown) each of which is disposed between the corresponding stationary member 6 and the movable member 4. Similar to the first preferred embodiment, each supporting beam 42 extends at an angle with respect to the x-axis and the y-axis, and supports the movable member 4 in a shiftable manner in the y-axis direction. Moreover, each supporting beam 42 has an end 42A at its base portion, which is connected with the corresponding stationary member 6 via the corresponding rotatable supporter 8, and also has an end 42B at its front portion, which is connected with the movable member 4.

On the other hand, the midsection of each supporting beam 42 in the longitudinal direction is provided with a reinforcing portion 42C which is larger in width than the sections of the supporting beam 42 adjacent to the ends 42A and 42B. The reinforcing portion 42C is highly rigid such that it is less bendable than the other portions of the supporting beam 42.

The fourth preferred embodiment achieves substantially the same effect and advantages as the first preferred embodiment. Specifically, in the fourth preferred embodiment, since each supporting beam 42 is provided with the reinforcing portion 42C that is large in width at the midsection in the longitudinal direction, the supporting beam 42 can easily be made less bendable with the reinforcing portion 42C. Thus, the barrier $\Delta E$ of potential energy between the first switch position and the second switch position can be set to be much greater so as to provide a stable switching operation for the optical switch device 31.

Furthermore, based on examination results by, for example, the present inventors, in comparison with a comparative example in which no reinforcing portions were provided, the barrier $\Delta E$ (energy difference) of potential energy was about 1.3 times as great as the one of the comparative example when the rigidity value of the cross-section of each reinforcing portion 42C was set at least twice as large as the rigidity value of the cross-section of each end 42B. For example, in comparison with a comparative example shown with a double-dashed line in FIG. 13, the spring force of the supporting beams 42 during the shifting of the movable member 4 according to the fourth preferred embodiment has a greater maximum value and a smaller minimum value, such that a greater force is required for the shifting process. However, in comparison with the barrier $\Delta E'$ according to a comparative example shown with a double-dashed line in FIG. 14, the barrier $\Delta E$ of potential energy according to the fourth preferred embodiment was found to be about 1.3 times as great as the one of the comparative example. FIGS. 13 and 14 show a result in which the width of each end 42B is about 4 µm, the width of each reinforcing portion 42C is about 5 µm, and the length of each reinforcing portion 42C is about 65% of the length of the overall supporting beam 42.

Figure 15:
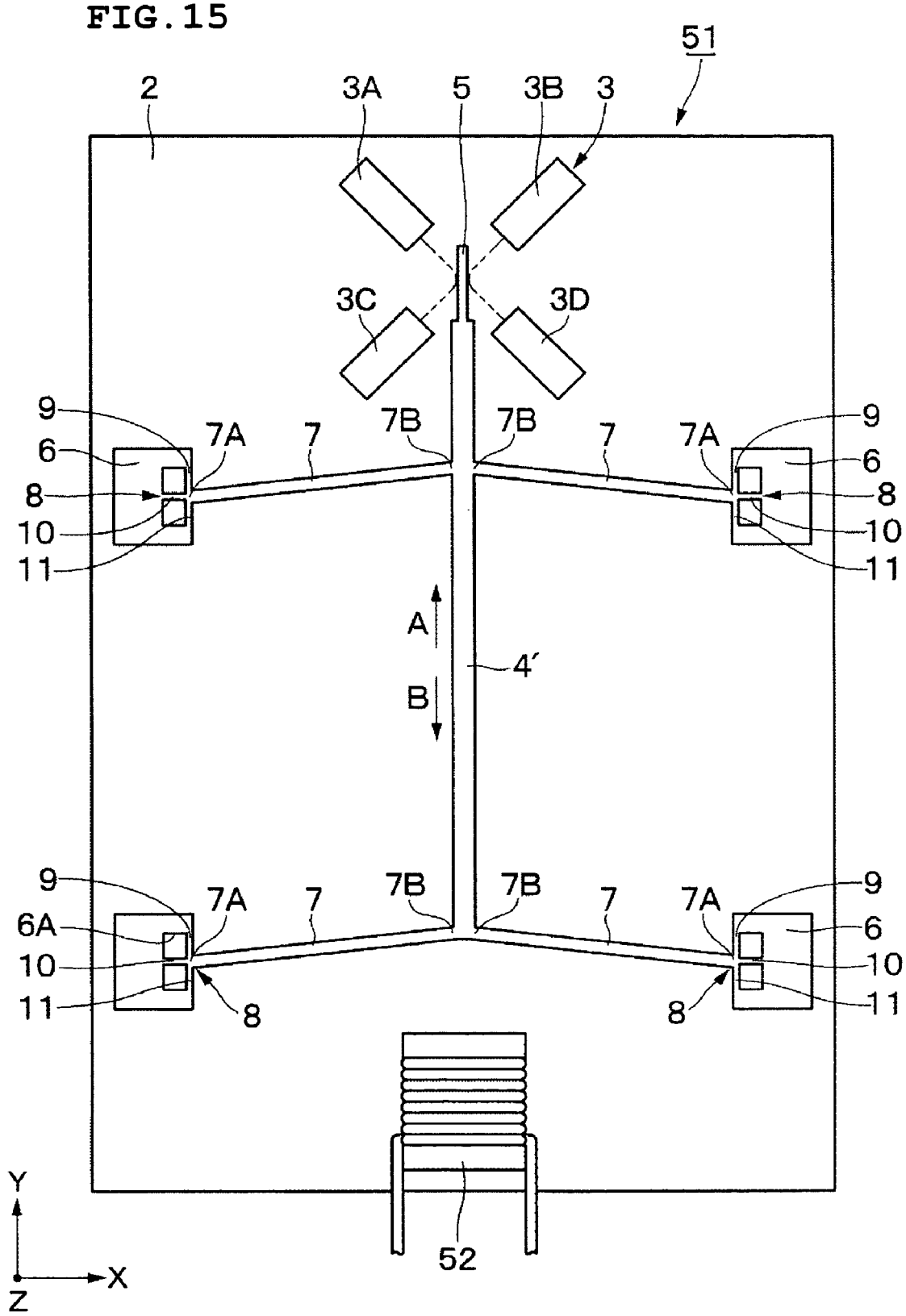
FIG. 15 is a partially-enlarged view of an optical switch device according to a fifth preferred embodiment of the present invention.

FIG. 15 illustrates a fifth preferred embodiment of the present invention. According to the fifth preferred embodiment, the movable member is shifted with a magnetic force. In the fifth preferred embodiment, components equivalent to those in the first preferred embodiment are indicated by the same reference numerals, and descriptions of those components will thus be omitted.

Reference numeral 51 indicates an optical switch device. Similar to the first preferred embodiment, the optical switch device 51 includes the substrate 2, a movable member 4', the stationary members 6, the supporting beams 7, and the rotatable supporters 8. The movable member 4' is formed of a magnetic material, and the electrodes 12 to 15 for generating an electrostatic force according to the first preferred embodiment are not provided.

Reference numeral 52 indicates an electromagnet which is adjacent to an end of the movable member 4' and is disposed on the substrate 2. The electromagnet 52 functions as a switching device such that when electric power is supplied to the electromagnet 52 from an external source, the electromagnet 52 generates a magnetic force (magnetic field) based on, for example, electrical polarities. This magnetic force allows the movable member 4' to be shifted.

When a current is supplied to the electromagnet 52 in a certain direction, for example, the electromagnet 52 generates a magnetic field that is repulsive against the movable member 4' so as to shift the movable member 4' towards the first switch position. In contrast, when a current is supplied to the electromagnet 52 in the opposite direction, the movable member 4' is magnetically drawn towards the electromagnet 52 such that the movable member 4' is shifted towards the second switch position.

The fifth preferred embodiment achieves substantially the same effect and advantages as the first preferred embodiment. Specifically, in the fifth preferred embodiment, because the movable member 4' can be shifted by using the electromagnet 52, the movable member 4 does not require power-supply elements, such as electrodes. This simplifies the structure of the optical switch device 51.

Accordingly, of the movable member 4 and the stationary members 6 in the first preferred embodiment, only the stationary members 6 are provided with the rotatable supporters 8, whereas, in the third preferred embodiment, both the stationary members 6 and the movable member 32 are respectively provided with the rotatable-supporters 33 and 37. However, the present invention is not limited to these structures. For example, the rotatable supporters disposed on the stationary members may be omitted, such that only the movable member is provided with the rotatable supporters.

Furthermore, although each rotatable supporter according to the above-described preferred embodiments is provided with three or five arm portions, the present invention is not limited to these structures. For example, each of the rotatable supporters may alternatively be provided with four arm portions or at least six arm portions.

Furthermore, the scope of the present invention also includes modifications where at least two of the second to fifth preferred embodiments may be freely combined. For example, the rotatable supporters 23 according to the second preferred embodiment may be provided on both ends of each supporting beam, and the supporting beam may be provided with a reinforcing portion at its midsection. Moreover, the movable member may be shifted with a magnetic force.

Furthermore, although an electrostatic force or a magnetic force is preferably used for the switching device in the above-described preferred embodiments, the present invention is not limited to such types of forces. For example, a piezoelectric force may alternatively be used.

Furthermore, although the above-described preferred embodiments are directed to examples in which a buckling actuator is applied to an optical switch device, the present invention may include other types of buckling actuators that have a mechanism for maintaining a movable member at two stable switch positions and further other types of apparatuses provided with such a buckling actuator.

While the present invention has been described with respect to preferred embodiments, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

The invention claimed is:

1. A buckling actuator comprising:
a substrate;
a movable member disposed above the substrate and shiftable in a predetermined shifting direction;
a stationary member which is disposed on the substrate and supports the movable member;
a supporting beam which is connected between the stationary member and the movable member in a buckling manner and supports the movable member at one of two switch positions selectively, the two switch positions being distant from each other in the shifting direction of the movable member; and
a switching device arranged to switch the position of the movable member; wherein
at least one of a connecting section between the stationary member and the supporting beam, and a connecting section between the movable member and the supporting beam is provided with a rotatable supporter supporting the supporting beam in a rotatable manner about an axis line extending substantially perpendicular to the substrate; and
the rotatable supporter includes at least three arm portions extending in directions that are different from one another.

2. The buckling actuator according to claim 1, wherein said at least three arm portions of the rotatable supporter include three arm portions extending away from an end of the supporting beam so as to define a substantially T-shaped configuration.

3. The buckling actuator according to claim 1, wherein said at least three arm portions of the rotatable supporter extend away from an end of the supporting beam in a radial arrangement.

4. The buckling actuator according to claim 1, wherein each of the connecting section between the stationary member and the supporting beam and the connecting section between the movable member and the supporting beam is provided with the rotatable supporter, such that each end of the supporting beam is rotatably supported by the corresponding rotatable supporter.

5. The buckling actuator according to claim 1, wherein a midsection of the supporting beam in the longitudinal direction of the supporting beam is provided with a reinforcing portion having higher rigidity than other sections of the supporting beam.

6. The buckling actuator according to claim 5, wherein a cross-section of the reinforcing portion is at least twice as rigid as a cross-section of each end of the supporting beam.

7. The buckling actuator according to claim 1, wherein the switching device shifts the movable member by using an electrostatic force.

8. The buckling actuator according to claim 1, wherein the switching device shifts the movable member by using a magnetic force.

9. The buckling actuator according to claim 1, wherein the switching device shifts the movable member by using a piezoelectric force.

10. The buckling actuator according to claim 1, wherein the movable member, the stationary member, the supporting beam, the rotatable supporter, and the switching device are composed of a single-crystal silicon material.

11. The buckling actuator according to claim 1, wherein the movable member moves toward and away from an optical path provided above the substrate based on the switch positions such that the movable member defines an optical switching unit for switching the optical path, the movable member being maintained at a corresponding one of the switch positions with a resilient force of the supporting beam.

12. The buckling actuator according to claim 1, further comprising a plurality of stationary members and supporting beams, wherein four of the rotatable supporters are provided between respective ones of the stationary members and a corresponding one of the supporting beams.

13. The buckling actuator according to claim 12, wherein each of the four rotatable supporters includes three bendable arm portions defining connecting sections between the corresponding stationary member and the corresponding supporting beam.

14. The buckling actuator according to claim 13, wherein each set of the three bendable arm portions defines a substantially T-shape configuration and supports the corresponding supporting beam in a rotatable manner about an axis line.

15. The buckling actuator according to claim 13, wherein each set of the three bendable arm portions extend from an end of the corresponding supporting beam in directions that are different from one another.

16. The buckling actuator according to claim 13, wherein each set of the three bendable arm portions extend away from a center of rotation O at an end of the corresponding supporting beam in a radial arrangement.

17. The buckling actuator according to claim 13, wherein each set of the three bendable arm portions are arranged such that two arm portions extend linearly along a y-axis in opposite directions and a third arm portion extends linearly along an x-axis in a direction that is substantially perpendicular to the shifting direction of the movable member.

18. The buckling actuator according to claim 13, wherein the three bendable arm portions are arranged such that two arm portions extend linearly along a y-axis in opposite directions and a third arm portion extends linearly along an x-axis in a direction that is substantially perpendicular to the shifting direction of the movable member.

19. An optical switch device comprising the buckling actuator according to claim 1.

* * * * *